United States Patent [19]

Taylor

[11] 4,312,046
[45] Jan. 19, 1982

[54] VERTICAL FUSE AND METHOD OF FABRICATION

[75] Inventor: David L. Taylor, Carrollton, Tex.

[73] Assignee: Harris Corporation, Melbourne, Fla.

[21] Appl. No.: 81,978

[22] Filed: Oct. 4, 1979

[51] Int. Cl.³ .............................................. G11C 11/40
[52] U.S. Cl. .................................... 365/104; 365/105; 365/175
[58] Field of Search ............... 365/104, 105, 174, 189, 365/175

[56] References Cited

U.S. PATENT DOCUMENTS 4,208,727  6/1980  Redwine ............................. 365/104

Primary Examiner—Terrell W. Fears
Attorney, Agent, or Firm—Leitner, Palan, Martin & Bernstein

[57] ABSTRACT

In a memory array wherein each cell includes an emitter follower, a diode is formed on the emitter by a thin layer which is capable of being shorted by vertical migration of bit line atoms through the layer and into the emitter region. The thin layer is fabricated by epitaxially growing the thin layer over the wafer with the emitter diffusion aperture open, oxidizing the epitaxial layer, selectively removing portions of the polycrystalline epitaxial layer and removing the oxide from the remaining epitaxial layer in the emitter diffusion aperture.

19 Claims, 11 Drawing Figures

4,312,046

VERTICAL FUSE AND METHOD OF FABRICATION

BACKGROUND OF THE INVENTION

The present invention relates generally to programmable read only memories (PROM) and more specifically to programmable read only memories which use a vertical fuse technique.

PROM array or matrices generally include a plurality of cells each including a fusible element and an isolating device, for example, a diode, connected in series between a bit line and a word line. Programming of the cell includes destroying the fusible element to store an open logic state therein versus the connected logic state. Initially the fusible element was a thin metal wire, for example, nichrome, which would melt on the passage of large currents therethrough. With the development of integrated circuits, the designers attention was concentrated on providing a totally integrated circuit technique to PROMS. A typical example of totally integrated circuit PROM arrays is shown in U.S. Pat. No. 3,641,516 to Castrucci, et al., wherein two back-to-back diodes connected in series between the word and bit line, are formed laterally in a junction-isolated region. The cell is programmed by applying voltage across one of the diodes using a special third metal contact to produce a fusing current which causes a metal-semiconductor alloy to form at the surface of the substrate and short out the reverse diode.

The equivalency of the back-to-back diode to a bipolar transistor is discussed in U.S. Pat. No. 3,733,690 to Rizzi et al. The word and bit lines are connected to the emitter and collector, respectively. A surface short between the base and the collector or the base and emitter along the surface of the semiconductor material is accomplished by migration of the contact material upon the application of electrical power to the cell. The programming of two serial connected, serial opposed Schottky diodes formed in a junction isolated region using surface migration or shorts is described in U.S. Pat. No. 3,781,825 to Burker et al.

In these systems using surface migration, the bipolar transistor or back-to-back diodes are formed having three laterally spaced surface contacts in a junction isolated region. The use of the junction isolation between cells requires extensive surface area. Similarly, three surface contacts also increases the amount of surface area needed to form a matrix. Thus, although these systems provide reduction in manufacturing expense and materials by using integrated techniques versus metal fuses, the requirement of junction isolation between cells as well as the amount of surface area needed for three surface contacts undesirably increases the size of the matrix. Thus, there exists a need for a PROM cell which minimizes the amount of area required.

SUMMARY OF THE INVENTION

The object of the present invention is to provide a programmable read only memory which requires a minimum amount of space per cell.

Another object of the present invention is to provide a programmable read only memory using completely integrated circuit techniques.

A further object of the present invention is to use a vertical fuse technique which is compatible with integrated circuit fabrication.

The objects of the present invention are achieved by using a diode formed by a very thin layer as the fusible element on the emitter of an unisolated emitter follower array. The thin film fuse is programmed by apply sufficient voltage thereacross to form a vertical short by vertical migration of atoms of the bit line contact material vertically through the thin layer into the emitter region. With aluminum as the bit line metal, the fusible element can be a Schottky diode wherein the thin layer is a low impurity concentration N-type region. If the thin layer is a single crystalline, high impurity concentration P+ region formed on an N+ emitter, the fusible element is a zener diode. If the thin layer is a polycrystalline P-type material formed on an N-type emitter, the fusible element is a PN diode.

The process of fabrication begins by epitaxially growing the thin layer over the wafer with the emitter diffusion aperture exposed. The epitaxial layer is then partially oxidized and portions of the polycrystalline epitaxial layer and superimposed oxide layer formed over the insulative layer of the wafer are removed. The oxide over the thin layer in the emitter diffusion aperture and the remaining polycrystalline portion is removed and a metallic contact is formed on the thin epitaxial layer. Depending upon the impurity levels and conductivity type, various types of diodes are formed.

Other objectives, advantages and novel features of the present invention will become apparent when considered in conjunction with the accompanied drawings.

DESCRIPTION OF THE PREFERRED EMBODIMENTS

Figure 1:
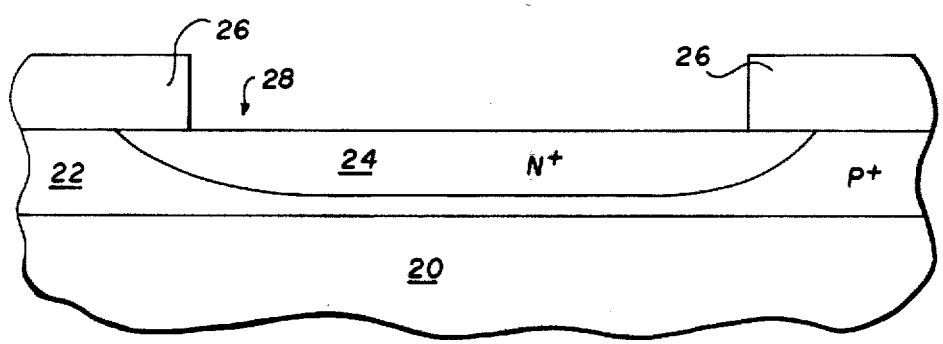
FIGS. 1-4 are crossectional views of a wafer during different stages of fabrication according to the principles of the present invention.

A PROM of the present invention includes an array or matrices of cells each including an emitter follower and a thin layer of semiconductor material which constitutes the programmable element. The programmable element is a diode which is vertically shorted by vertical electromigration of atoms from the metallic contact material through the thin layer into the emitter of the emitter follower. By using emitter followers as cell isolation devices and a vertical fusing technique, a minimum amount of surface area per cell is required for the array. The emitter follower array may be formed by diffusing P+ regions 22 into an N-type substrate or epitaxial layer to form base regions. An insulative layer of oxide 26 is formed on the surface of the base regions 22. An aperture 28 is then formed in the oxide 26 over each base region to define emitter diffusion aperture. N+ type impurities are then diffused through the apertures 28 to form an N+ emitter regions 24 in each base region 22.

The process to this point is standard prior art. The emitter followers may be formed by other processes if so desired. The essence of the emitter follower configuration is that a single contact is used for each word line to a common base formed on a common collector for all the cells in the array and a single collector contact is used for the whole array. This minimizes the surface space needed for base and collector contact as well as removing any need for cell to cell junction isolation.

Figure 2:
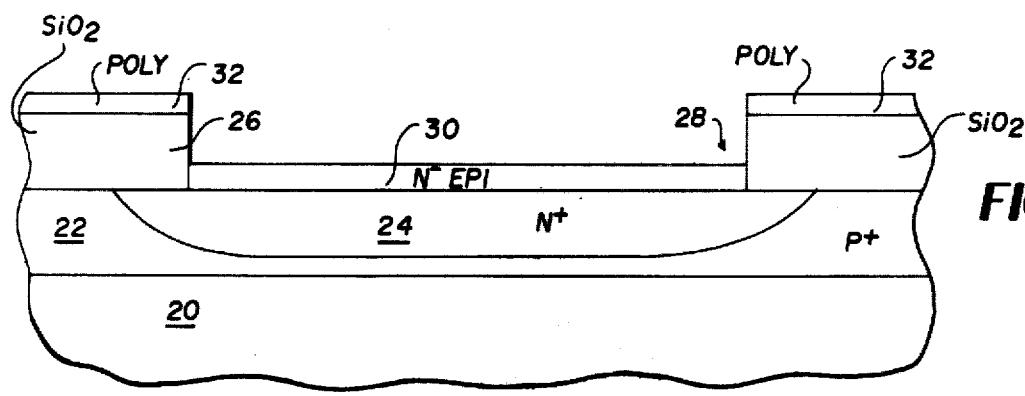
Figure 3:
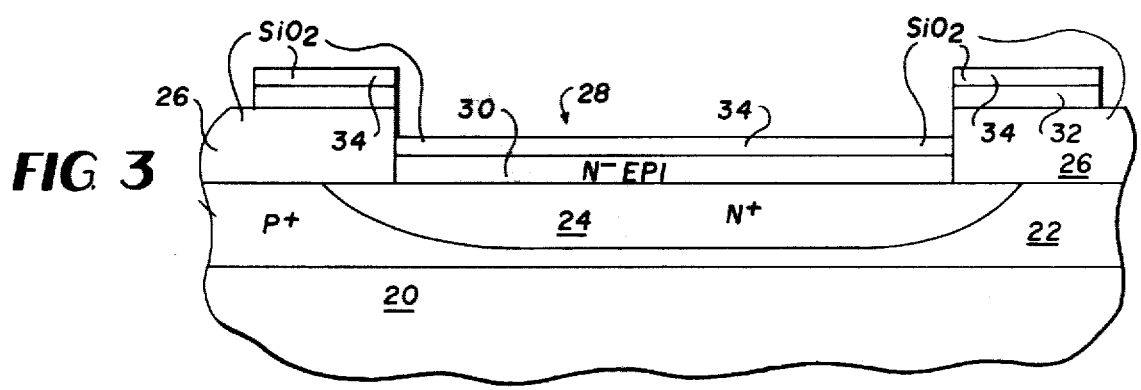

The process of the present invention begins by washing or removing the oxide from the emitter apertures of the cells formed during the diffusion of the emitter impurities. The structure at this point is illustrated in FIG. 1. A thin epitaxial layer is then grown over the wafer resulting in a simultaneous growth of a single crystalline doped layer 30 in the emitter apertures 28 on the surface of the emitter region 24 and doped polycrystalline layer 32 over the insulative or oxide layer 26 as illustrated in FIG. 2. The wafer is then subjected to an oxidizing atmosphere oxidizing the epitaxial layer 30 and the polycrystalline epitaxial layer 32 to form an oxide layer 34 thereon. The polycrystalline material is then removed from all regions except a small portion contigious to the cell emitter regions. This removal might be performed by forming a masking layer, preferably a photoresist material, exposing the photoresist to define the areas to be removed and subjecting the wafer to etchants which will remove the exposed photoresist and the oxide and polycrystalline layer thereunder. By not removing the polycrystalline layer 32 contigious to the emitter apertures, the emitter aperture is isolated or protected during the etch removal of the portions of the polycrystalline epitaxial layer 32. The resulting structure is illustrated in FIG. 3.

Figure 4:
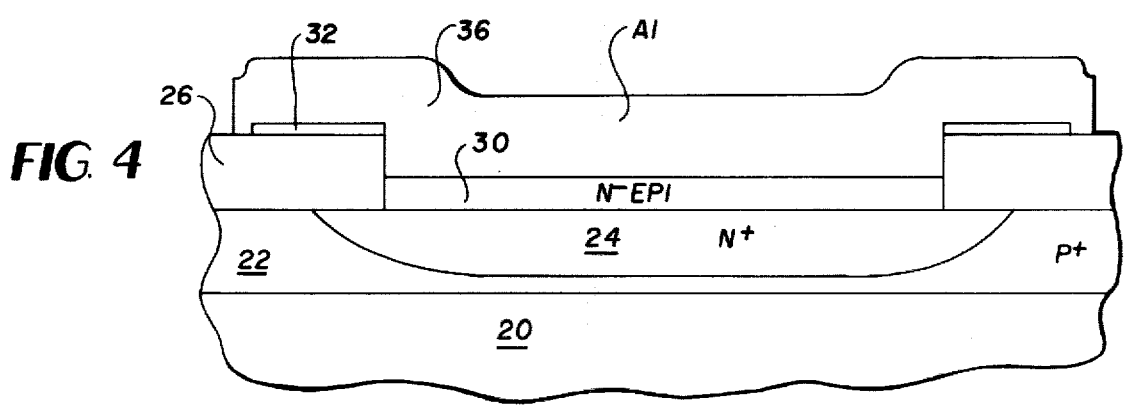
Figure 5:
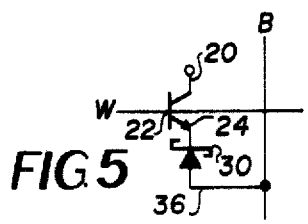
FIG. 5 is a schematic of the memory cell of FIG. 4.

The wafer is then subjected to another wash which will remove oxide layer 34 from all the cell emitter regions and remaining polycrystalline layer as well as the emitter regions of the input and output circuitry for the matrix. A metallic layer of conductive material is then applied and delineated using a mask and etching process to define the contact and word and bit lines of the matrix. The final structure is illustrated in FIG. 4 showing a bit line contact 36 to the epitaxial layer 30. As illustrated in the schematic of FIG. 5, a Schottky diode is formed between the bit line contact 36 and the epitaxial layer 30. By forming the epitaxial layer of lightly doped N conductivity type impurities and using a bit line contact 36 of aluminum, A Schottky junction is formed. As is well-known in the prior art, the impurity concentration of the epitaxial layer 30 should be below $10^{17}$ atoms per cubic centimeters to form a Schottky junction.

Preferably the N− epitaxial layer 30 has a thickness of approximately 0.5 microns and a resistivity of 0.2 ohm-centimeters. The original epitaxial layer thickness as grown, as well as the period of oxidation, will define the final thickness of the epitaxial layer 30. Although 0.5 microns is an example of a desired thickness, it is important that the thickness be below 1.0 micron. This thickness will provide a layer capable of operating as a diode layer with the aluminum contact 36 in normal read operations of the cell as well as allowing shorting across this region in a minimum amount of time with a minimum amount of power.

Programming of the cell is achieved by addressing the cell using the word line W and the bit line B for the specific cell. This would apply a potential from line 36 across layer 30 and emitter 24 and base 22. For an appropriately applied voltage, aluminum atoms from the contact 36 will migrate vertically across region 30 forming an electrical short directly to the emitter region 24. By forming the region 30 on the surface of the emitter surrounded by the surface insulator or oxide layer 26, only vertical migration occurs to create a vertical short. Also since the region to be shorted is the thin epitaxial layer 30, which is vertically shorted, no additional lateral surface area is needed for the fuse element. For a 0.5 micron, 0.2 ohm-centimeter epitaxial layer, a voltage of approximately 10 volts thereacross for approximately 30 milliseconds is sufficient to create a vertical short.

Figure 7:
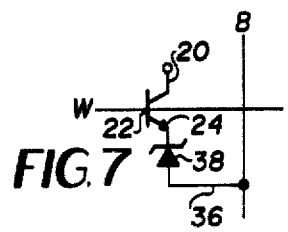
FIG. 7 is a schematic of the memory cell of FIG. 6.
Figure 6:
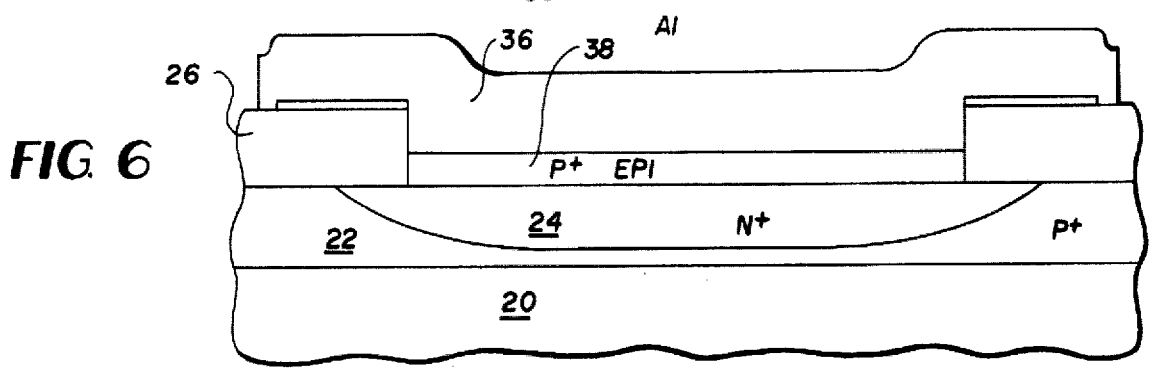
FIG. 6 is a crossectional view of another memory cell incorporating the principles of the present invention.

An alternative structure is illustrated in FIGS. 6 and 7 wherein a P+ epitaxial layer 38 is formed instead of the N− epitaxial layer 30. This results in an N+/P+ zener diode being formed between the emitter and the bit line contact 36. The programming of the structure is the same as that for the Schottky diode. It should be noted that for either of the structures of FIGS. 4 or 6, that a small impedance programming device is needed. Thus, an extremely high power density in the thin epitaxial region 30 or 38 would readily induce migration of aluminum particles therethrough.

Figure 9:
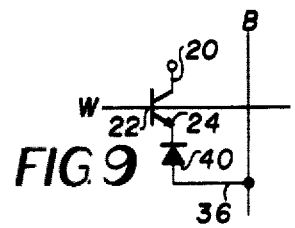
FIG. 9 is a schematic of the memory cell of FIG. 8.
Figure 8:
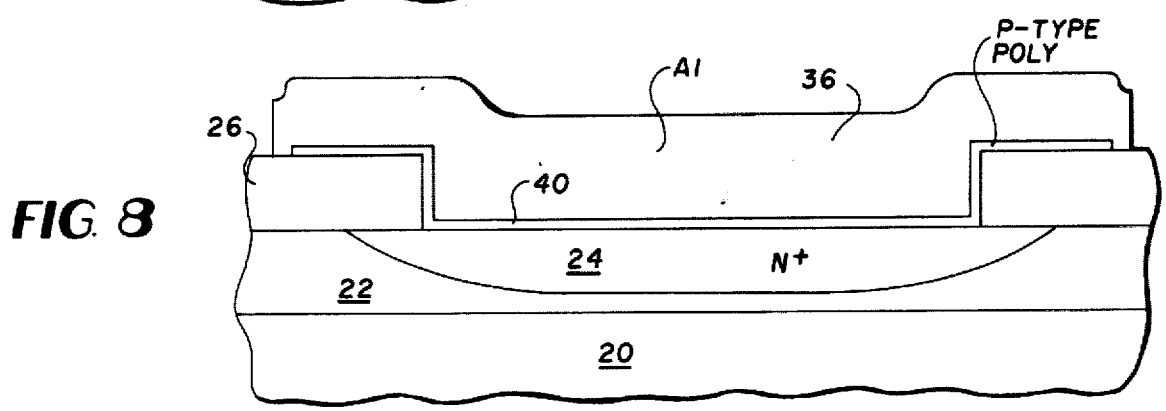
FIG. 8 is a crossectional view of another memory cell incorporating the principles of the present invention.

A third embodiment of the principles of the present invention having a vertical fuse is illustrated in FIGS. 8 and 9, the thin layer between the bit contact 36 and the emitter region 24 is illustrated as a polycrystalline P conductivity layer 40. This layer is formed by a low temperature deposition to form a polycrystalline versus a single crystalline layer. This results in a diode structure wherein the aluminum migrates through the polycrystalline much more readily than through the single crystalline structure. The resulting diode is a lower quality than the previously described diode and has a lower breakdown voltage.

Figure 10:
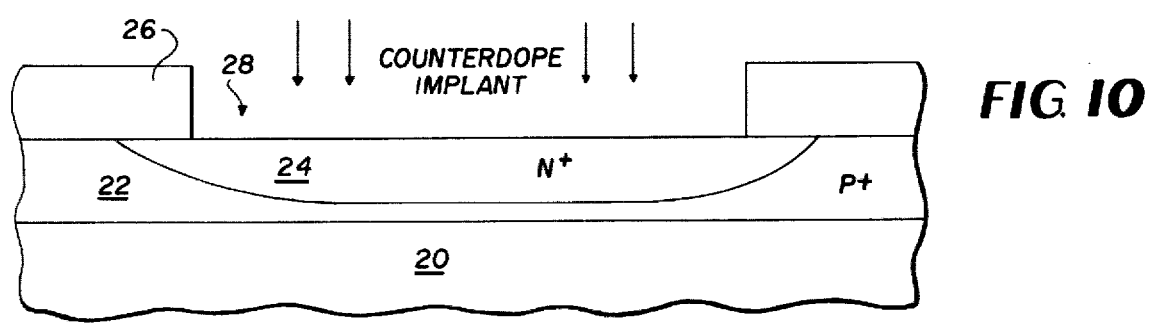
FIGS. 10 and 11 are crossectional views of different stages of fabrication of even another memory cell incorporating the principles of the present invention.
Figure 11:
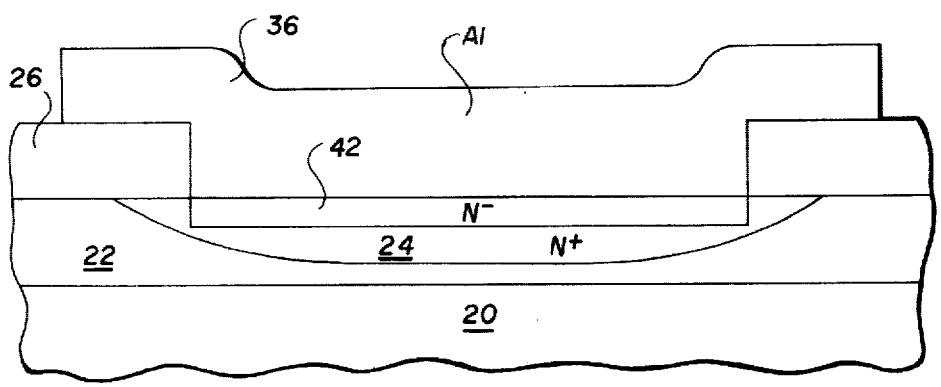

Although the present invention has been illustrated as a thin epitaxial layer formed on the surface of the emitter region and surrounded laterally by the surface insulative or oxide layer 26, the Schottky diode of FIG. 5 may be formed by an alternative method. As illustrated in FIG. 10, the surface of the N+ emitter 24 is counterdope with a P type impurities implanted into the surface thereof. Region 42, having a thickness of approximately 0.3 microns and an impurity concentration of less than $10^{17}$ atoms per cubic centimeter is formed. The region 42 forms with the aluminum bit contact 36 a Schottky diode. Since the N− region 42 is relatively thin compared to the lateral distance of the region 42 from the base region, the migration of the aluminum atoms from the contact 36 will form a vertical short to the emitter 24 before it will form a horizontal or lateral short to the base region 22. Thus, even a doped region formed in the surface of the emitter of the emitter follower bipolar transistor can take advantage of the vertical short technique of the present invention without increasing the surface area needed.

From the preceding description of the preferred embodiments, it is evident that the objects of the invention are attained in that a high density PROM array is provided using a thin layer forming a diode capable of being vertically shorted. Although the invention has been described and illustrated in detail it is to be clearly understood that the same is by way of illustration and example only and is not to be taken by way of limitation. The spirit and scope of this invention are to be limited only by the terms of the appended claims.

What is claimed:

1. A programmable read only memory array having a plurality of word lines and bits lines intersecting at a plurality of cells, each cell comprising:
   a first semiconductor region of a first conductivity type;
   a second semiconductor region of a second conductivity type formed in said first semiconductor region, said first and second semiconductor regions forming a first diode;
   a third semiconductor region formed contiguous to said second semiconductor region having a shallow depth and having lateral dimensions smaller than the lateral dimensions of said second semiconductor region;
   a bit line making contact with the top surface of said third semiconductor region;
   a second diode being formed between said bit line and said second semiconductor region; and
   a word line making contact with the first semiconductor region a sufficient distance from said third semiconductor region such that atoms of said bit line will migrate through said third semiconductor region and form a verticle short between the bit line and said second semiconductor region when a sufficiently high voltage is placed across said bit and word lines without forming a lateral short.

2. The programmable read only memory according to claim 1 wherein said semiconductor regions are silicon and said lines are aluminum.

3. A programmable read only memory according to claim 1 including an insulative layer on said first and second semiconductor regions, said third semiconductor region is on said second semiconductor in an opening in said insulative layer, and said word line is connected to said first semiconductor region through an opening in said insulative layer.

4. The programmable read only memory according to claim 1 wherein said third semiconductor region is formed in said second semiconductor region to depth sufficiently shallow compared to the lateral distance therefrom to said first semiconductor region to form a verticle short before any lateral short to said first semiconductor region.

5. The programmable read only memory according to claim 1 wherein said second diode is a Schottky diode formed between said third semiconductor region and said bit line, and said third semiconductor region is of said second conductivity type.

6. The programmable read only memory according to claim 1 wherein said third semiconductor region is of said first conductivity type, and said second diode is formed by said second and third semiconductor regions.

7. A read only memory array having a plurality of word lines and bit lines intersecting at a plurality of cells, each cell comprising:
   a common substrate of a first conductivity type;
   a first semiconductor region of second conductivity type on said common substrate forming a first diode with said substrate;
   a word line making contact with said first semiconductor region;
   a second semiconductor region of said first conductivity type forming a second diode with said first semiconductor region;
   a third semiconductor region contiguous to said second semiconductor region;
   a bit line making contact with said third semiconductor region;
   a third diode is formed between said bit line and said second semiconductor region; and
   at least one cell in said array having a vertical short formed between the bit line and the second semiconductor region by atoms of the bit line.

8. A read only memory according to claim 7 including an insulative layer on said first and second semiconductor regions, said third semiconductor region is on said second semiconductor in an opening in said insulative layer, and said word line is connected to said first semiconductor region through an opening in said insulative layer.

9. A read only memory according to claim 7 wherein said third diode is a Schottky diode formed between said third semiconductor region and said bit line, and said third semiconductor region is of said second conductivity type.

10. A read only memory according to claim 7 wherein said third semiconductor region is of said first conductivity type, and said third diode is formed by said second and third semiconductor regions.

11. The read only memory according to claim 7 wherein said bit line is aluminum and said third semiconductor region is silicon of N conductivity type sufficiently low in impurity concentration to form a Schottky diode with said aluminum.

12. A programmable read only memory having a plurality of cells, each cell comprising:
   an emitter follower with its base connected to a word line, its collector connected to a supply line and its emitter connected to a bit line via a programmable element;
   said programmable element being a diode having a thin layer between said bit line and said emitter sufficiently thin to be vertically shorted by bit line atom migration when a sufficient voltage is applied across the bit and word lines.

13. The programmable read only memory according to claim 12 wherein said layer has a thickness of less than one micron.

14. The programmable read only memory according to claim 12 wherein said collector is a common substrate for all cells and said base is common for all cells of a word.

15. The programmable read only memory according to claim 12 wherein said emitter follower is an NPN transistor and said bit line is aluminum.

16. The programmable read only memory according to claim 15 wherein said thin layer is an N conductivity type layer of low impurity concentration and said diode is a Schottky diode formed between said layer and said aluminum bit line.

17. The programmable read only memory according to claim 12 wherein said thin layer is formed on the surface of said emitter and is laterally encompassed by a surface insulating layer.

18. The programmable read only memory according to claim 17 wherein said thin layer is P conductivity type and said diode is a p-n diode formed between said thin layer and said emitter.

19. The programmable read only memory according to claim 18 wherein said thin layer is polycrystalline material.

* * * * *